United States Patent [19]
Carlson et al.

[11] Patent Number: 5,983,006
[45] Date of Patent: Nov. 9, 1999

[54] METHOD FOR ANALYZING AND EFFICIENTLY ELIMINATING TIMING PROBLEMS INDUCED BY CROSS-COUPLING BETWEEN SIGNALS

[75] Inventors: Roy Carlson, Hillsboro; Hans J. Greub, Cornelius, both of Oreg.

[73] Assignee: Intel Corporation, Santa Clara, Calif.

[21] Appl. No.: 09/001,407

[22] Filed: Dec. 31, 1997

[51] Int. Cl.⁶ .................................................. G06F 11/24
[52] U.S. Cl. .............................. 395/500.05; 395/500.07
[58] Field of Search ...................... 73/19.03, 602, 73/609; 327/307; 361/774, 775; 364/488, 489, 490, 491, 578; 395/500

[56] References Cited

U.S. PATENT DOCUMENTS 5,535,133  7/1996  Petschauer et al. ................... 364/489

OTHER PUBLICATIONS

'Analysis, reduction and Avoidance of Crosstalk on VLSI Chips', Tilmann Stohr et al., ACM Journal I–58113–021–x/98/4, pp. 211–218, 1998.

'Results of Analyzing VLSI Interconnect Structures by a methodology Based on Mixed Frequency–Time Domain', Salvador Perdomo and antonio Nunez, IEEE 1993, 1066–1409–93, pp. 409–413, 1993.

Lassszlo Gal, 'On–Chip Cross Talk—the New Signal Integrity Challenge', IEEE 1995 Custon Integrated Circuits Conference, pp. 251–254, 1995.

Selected pp. (143, 330 and 334) from the Hewlett Packard 1994 Test & Measurements Catalog, 1994.

*Primary Examiner*—Kevin J. Teska
*Assistant Examiner*—Lonnie A. Knox
*Attorney, Agent, or Firm*—Blakely, Sokoloff, Taylor & Zafman LLP

[57] ABSTRACT

This invention illustrates a method is provided for analyzing cross-coupling between an attacker signal line, upon which an attacker signal resides, and a victim signal line, upon which a victim signal resides. The method in this invention comprises the acts of selecting the victim signal, selecting the attacker signal, performing timing filtering upon a number of signal lines in order to identify a set of potential attacker signals, performing logic filtering upon a number of signal lines to identify a second set of potential attacker signals, and reducing the effects of the cross-coupling between the attacker signal line and the victim signal line.

13 Claims, 8 Drawing Sheets

METHOD FOR ANALYZING AND EFFICIENTLY ELIMINATING TIMING PROBLEMS INDUCED BY CROSS-COUPLING BETWEEN SIGNALS

BACKGROUND OF THE INVENTION

1. Field of the Invention

This invention relates generally to analyzing and eliminating the effects of signal to signal cross-coupling, and more particularly, to performing timing filtering and logic filtering to efficiently analyze and eliminate the effects of signal to signal cross-coupling.

2. Description of the Related Art

In electronic circuit applications, such as sub-micron and PC-board circuits, signal to signal cross-talk is a problem that is very difficult to control and overcome. Often, a capacitance develops between two or more signals, called cross-capacitance. Due to cross-capacitance, transitions in one signal can influence the behavior of other signals. A signal whose behavior is influenced by the signal transitions of another signal, is called the victim signal. A signal that influences another signal by means of cross-talk is called the attacker signal. During different periods of the circuit operation, an individual signal can be a victim signal at one point in time and an attacker signal at another point in time.

Attacker signals can cause victim signals to make: inadvertent transitions; transitions too early; or transitions too late. Any of these situations can cause serious errors in electronic circuits. One of the most serious problems faced by designers occurs when an attacker signal causes the victim signal to transition too early or too late. These problems are known as dynamic delay variations.

Dynamic delay variations can occur when the attacker signal switches in the same direction as that of the victim signal. This can cause the driver to switch the victim signal too early because the victim signal is already being switched, at least partially, by the attacker signal. Similarly, when the attacker signal switches in the opposite direction, the driver could switch the victim signal too late because it has to remove additional charge that was placed there by the attacker signal. These slow-down and speed-up dynamic delay variations can cause serious errors in the performance of the electronic circuit.

To date, the primary method of addressing cross talk problems has been primarily a trial and error approach. Currently, there are no automated methods to address the dynamic delay variation problems that are caused by cross-coupling signals. Generally, designers are reduced to predicting where cross-coupling may occur or only addressing the signals that are actually known to have cross-coupling tendencies, such as signal busses, which are generally known to have high coupling capacitance between adjacent bits, and very similar timing patterns. The process of identifying and addressing the problems of cross-coupling induced dynamic delay variations with today's methods are, at best, guesswork, and they are inefficient.

The present invention is directed to overcoming, or at least reducing the effects of, one or more of the problems set forth above.

SUMMARY OF THE INVENTION

In the present invention, a method is provided for analyzing cross-coupling between an attacker signal line, upon which an attacker signal resides, and a victim signal line, upon which a victim signal resides. The method in the present invention comprises the acts of selecting the victim signal, selecting the attacker signal, performing timing filtering on a plurality of signal lines to identify a first set of potential attacker signals on a first set of potential attacker signal lines, performing logic filtering on the plurality of signal lines to identify a second set of potential attacker signals on a second set of potential attacker signal lines, and reducing the effects of the cross-coupling between at least one of the said potential attacker signal lines and the victim signal line.

BRIEF DESCRIPTION OF THE DRAWINGS

Other objects and advantages of the invention will become apparent upon reading the following detailed description and upon reference to the drawings in which.

Figure 1:
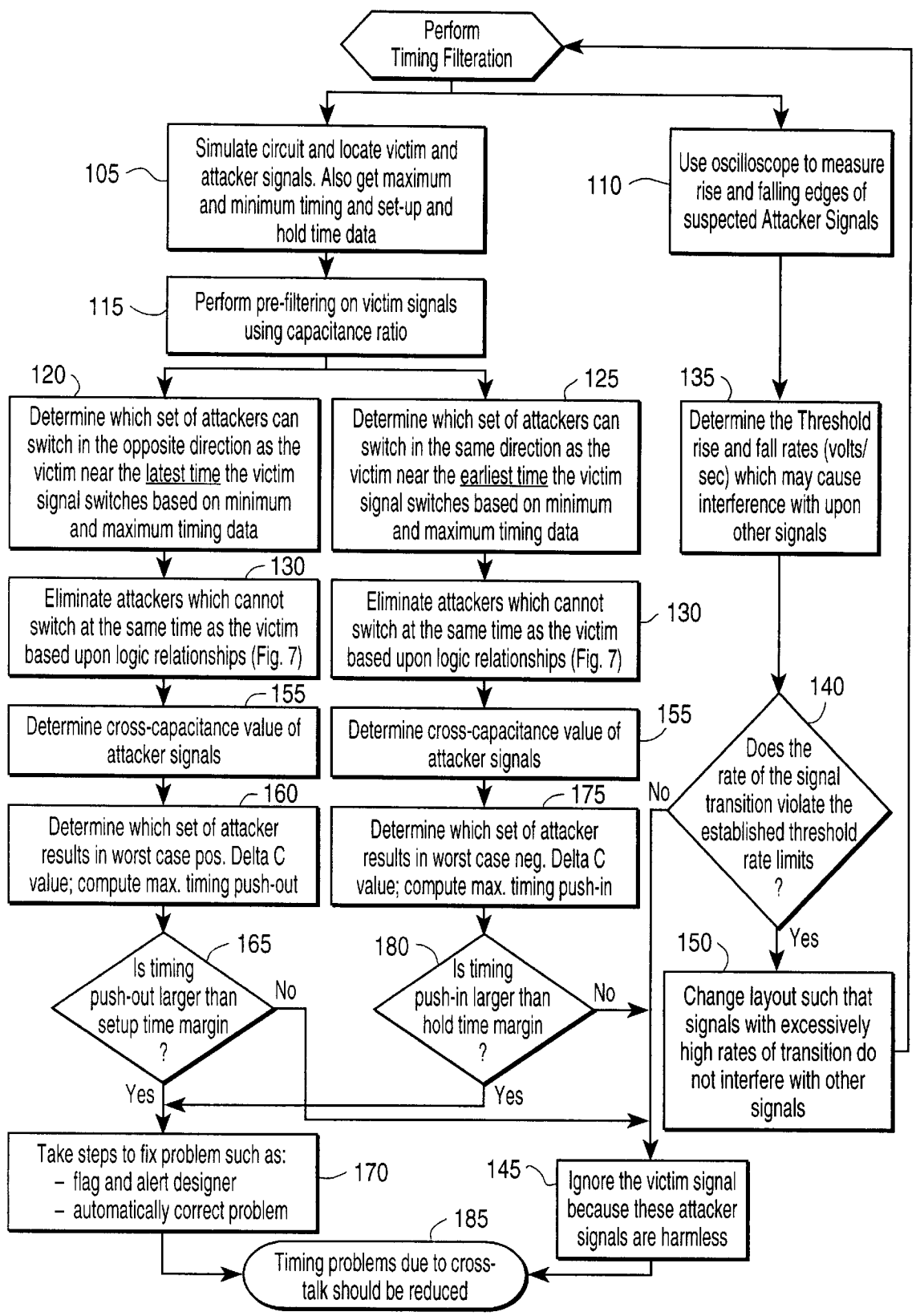
FIG. 1 is a flow chart illustrating one method for performing timing filtration.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In electronic circuits, there are generally several signals that can cross-talk with other signals and create timing problems. These timing problems cause errors in the functionality of the electronic circuits. To more efficiently identify the signals that cause the timing problems, it is useful to perform timing filtering and logic filtering on the electronic circuits.

Figure 2:
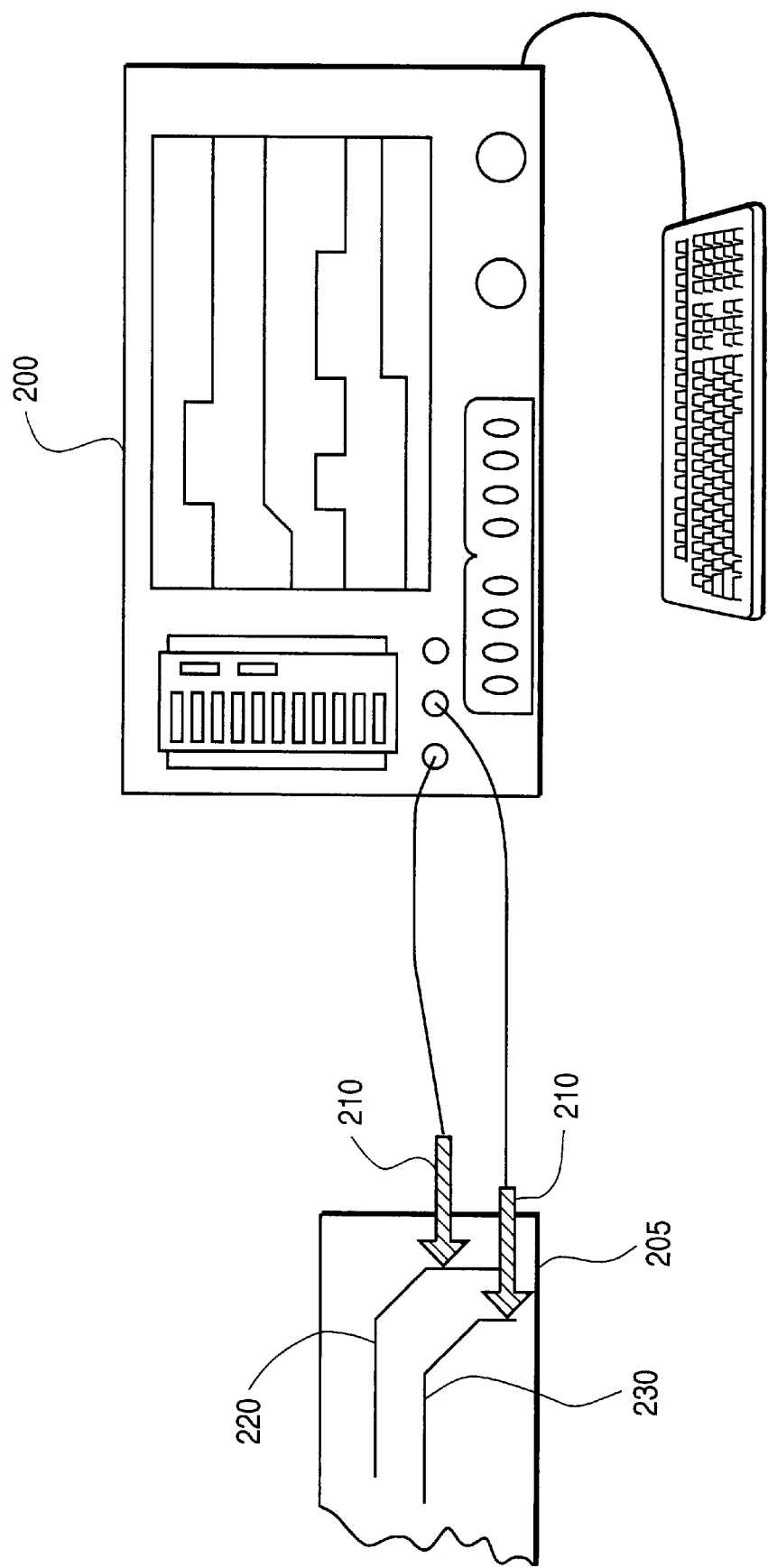
FIG. 2 illustrates a static timing device monitoring an attacker signal and a victim signal through signal probes.

Turning now to the drawings and referring to FIG. 1, a method for performing timing filtration is shown. Block 105 and block 110 illustrate the two procedures of timing filtration. One aspect of timing filtration, which is the analysis of the timing behavior patterns of various signals by using a static timing device, is initiated at block 105. The minimum and maximum timing data, as well as the setup and hold time data, are also analyzed at this point. FIG. 2 illustrates a static timing device 200, a semiconductor device 205 (or a PC-board in an alternative embodiment), and signal probes 210 coupling the static timing device 200 to traces 220, 230 on the semiconductor device 205. Electrical signals are delivered over these traces 220, 230 and are generally identified herein as a victim signal and an attacker signal. In one embodiment, a primary method for analyzing and eliminating dynamic delay variation problems, includes performing timing filtering and logic filtering upon the victim signal and the attacker signal. To perform timing filtering, the victim signal and attacker signal are analyzed by using the static timing device 200.

The static timing device 200 is, in one embodiment, a simulation device that is capable of timing simulation. The victim signal and the attacker signal are connected to the static timing device 200 through the signal probes 210. The static timing device 200 is programmed to simulate the timing of the victim signal and the attacker signal. That is, the static timing device 200, in combination with a parasitic extraction tool, produces a victim signal and attacker signal similar to those present on the corresponding traces 220, 230 of the semiconductor device 205 during normal operation. Timing analysis is performed on the victim and attacker signal using the static timing device 200.

Using the static timing device 200, the minimum and a maximum delay, as well as the set-up time and hold time margins are found. This is done by using the static timing device 200 to simulate the behavior of the corresponding signals on the semiconductor device 205 during normal operation. The semiconductor device is assumed to be functional regarding its set-up time and hold time of its signals. The static timing device 200 facilitates the simulation of signals without having to simulate all possible input stimulus patterns. During the signal-behavior simulation conducted in the static timing device 200, the transitions of potential attacker signals and victim signals are monitored.

Using the static timing device 200, the behavior of the attacker signals can be analyzed and the number of attacker signals that merit further analysis can then be limited to those that could actually cross-couple with the victim signals. The static timing device 200 captures the earliest up and down switching events of signals, including transition times, called minimum timing. The static timing device 200 also captures the latest up and down switching, including transition times, called maximum timing. The minimum and maximum timings correspond to the hold and setup timing, respectively, required to properly register signal transitions. Using the setup and hold time specification of the downstream sampling elements, the worst case setup and hold time margin for each signal can be established, thereby establishing the worst case maximum and minimum timings.

If a signal transition occurs after the maximum delay timeline 300 (shown in FIG. 3) plus the setup time margin 310, a timing push-out error results because the electronic circuit would not have time to properly register the new state of the signal. If a signal transition occurs before the minimum delay timeline 400 (shown in FIG. 4) minus the hold time margin 410, a timing push-in error results because the electronic circuit could possibly register an incorrect signal level. A timing push-out can occur if the attackers causes the victim signal transition to occur outside the set-up time margin 310. A timing push-in error can occur when the attacker signals causes the victim signal transition to occur outside the hold time margin 410. If the timing of the victim signal is such that neither a timing push-in nor a timing push-out error occurs, therefore operating properly within the switching timing window (or timing window) 320, then the effects of the attacker signals can be ignored.

Referring back to FIG. 1, at block 115, pre-filtering upon the victim signals is performed using capacitance ratio. Consider a victim node that is held at logic low, and a first attacker signal cross-talks with the victim signal and causes a signal noise spike upon the victim node. The maximum voltage spike that the victim signal experiences is defined by Equation 1:

$$V_{ul} = (C_{cc}/C_{vn}) \times V_{ps};$$ Equation 1 where $V_{ul}$ is the upper limit voltage of the signal noise spike experienced by the victim node, $C_{cc}$ is the cross-coupling capacitance experienced by the victim node, $C_{vn}$ is the capacitance of the victim node, and $V_{ps}$ is the power supply voltage. The upper limit voltage of the signal noise spike experienced by the victim node is directly proportional to the power supply voltage by a ratio of the cross-coupling capacitance and the victim node capacitance. Therefore, the upper limit voltage of the signal noise spike that the victim node experiences has a maximum value of that of the power supply voltage if the cross-coupling capacitance is the same as the victim node capacitance. If the voltage spike upon the victim signal is not appreciably high, then that signal can be eliminated as a victim signal.

A slow-down dynamic delay variation generally occurs when an attacker signal switches in the opposite direction as that of the victim signal. For example, the attacker signal switches from high-to-low at about the same time that the victim signal switches from low-to-high. This causes the victim signal to experience a signal-level pull in the direction of the attacker signal, forcing the driver (not shown) of the victim signal to drive more charge in order to switch the signal. Since the driver is required to drive more charge, it needs more time to drive the victim signal to the appropriate level, thereby causing the delay.

Figure 3:
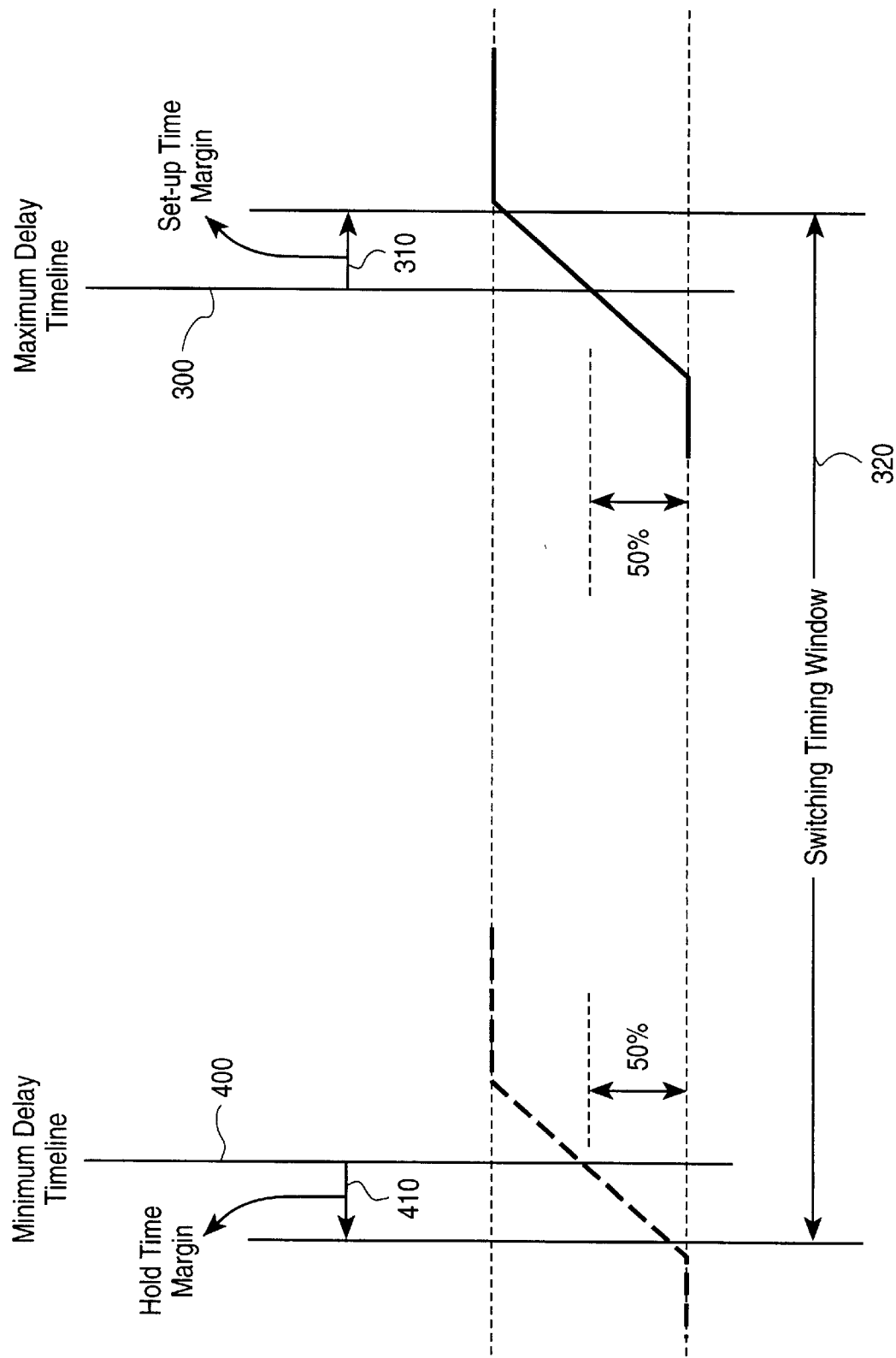
FIG. 3 shows a timing diagram in which a slow-down dynamic delay variation of a signal transition is illustrated.

One way to emulate this is by using the static timing device 200. If the static timing device 200 indicates that the victim signal does not complete its transition before a maximum delay, it can be concluded that the victim signal is experiencing a slow-down dynamic delay variation. A slow-down dynamic delay variation is shown in FIG. 3, where the victim signal fails to complete its transition before the maximum delay timeline 300 plus the set-up time margin 310.

A speed-up dynamic delay variation generally occurs when an attacker signal switches in the same direction as that of the victim signal. For example, both the attacker and victim signals switch from low-to-high at about the same time. The switching of the attacker signal causes a signal-level pulling effect upon the victim signal in the direction of the attacker signal's transition. Since the driver of the victim signal is driving it in the same direction as that of the signal-level pull caused by the attacker signal, the transition of the victim signal occurs too fast, thereby causing a speed-up dynamic delay variation.

Figure 4:
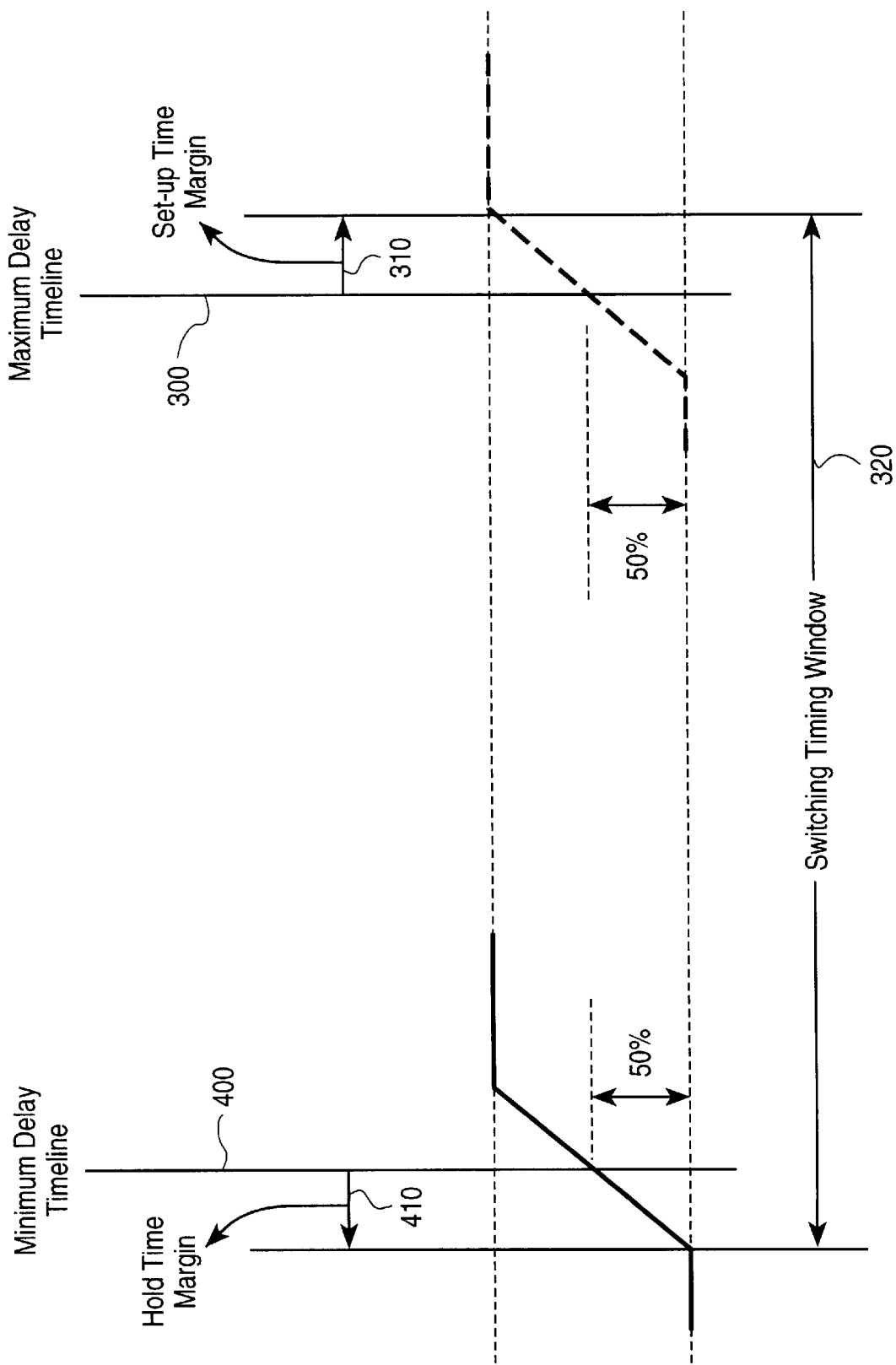
FIG. 4 shows a timing diagram in which a speed-up dynamic delay variation of a signal transition is illustrated.

One way to emulate this is by using the static timing device 200. When the static timing device 200 indicates that the victim signal has completed its transition before the minimum delay period, a speed-up dynamic delay variation has occurred, as specified at block 125. A speed-up dynamic delay variation is shown in FIG. 4, where the victim signal switches to a new voltage level before the minimum delay timeline 400 minus the hold time margin 410.

By studying the behavior of the victim signal, the cause of the dynamic delay variation, whether it is of the speed-up or the slow-down variety, can be found by analyzing the behavior of the attacker signals. Thus, the attacker signals that are causing timing problems are narrowed from a long list of potential attacker signals.

At block 120 of FIG. 1, a determination is made regarding which sets of attacker signals that are suspected of cross-talking with a victim signal, can switch in the opposite direction as that of the victim signal near the latest time that the victim signal switches, based on maximum and minimum timing data. Similarly, at block 125, a determination is made regarding which sets of attacker signals that are suspected of cross-talking with a victim signal, can switch in the same direction as that of the victim signal near the earliest time the victim signal switches. All suspected victim signals are cycled through these steps. The attacker signals that are found to not switch at the same time as the victim signal, based upon logic relationships between victim signals and attacker signal and relationship among attacker signals of a particular victim signal, can be eliminated, as described at block 130. This is illustrated by the example shown in FIG. 5.

Figure 5:
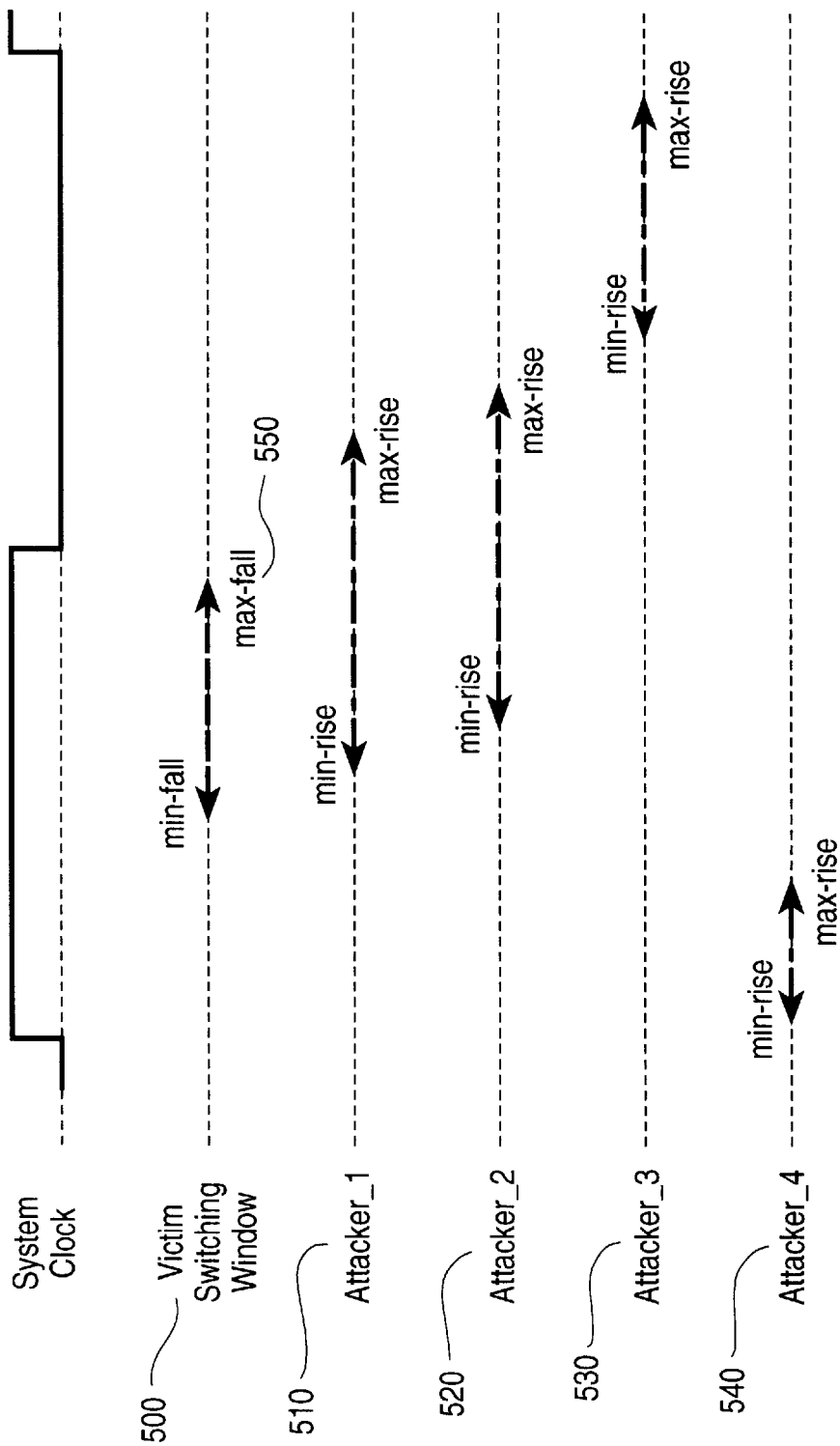
FIG. 5 illustrates an example of an application of timing filtration and logic filtration.

Turning now to FIG. 5, a victim switching window 500 and the transitions of four attacker signals are shown. In the example shown in FIG. 5, timing filtering can remove attacker_3 530 and attacker_4 540 from the set of potential attacker signals. This is true because attacker_3 530 and attacker_4 540 do not switch at the same time as the victim signal. Based upon maximum and minimum timing data, attacker_1 510 and attacker_2 520 could switch near the max-fall time 550 of the victim signal, thereby causing a timing push-out on the max-fall time 550 of the victim signal.

The maximum and minimum timing data provides an intermediate indication of the potential overlap. However, attacker_2 520 could be generated by an inverter, with its input connected to attacker_1 510 and still have shown the maximum and minimum timing windows. In this case, the application of logic filtering could detect this dependency and remove either attacker_1 510 or attacker_2 520 depending on which one has a larger cross-capacitance to the victim signal. Alternatively, logic filtering would eliminate both attacker_1 510 and attacker_2 520 if the inverter delay is small compared to the max-fall 550 transition time of the victim signal.

At block 110 in FIG. 1, a description of another aspect of timing filtering, analyzing the rising and the falling slopes of the transitions of potential attacker signals, is specified. The faster a signal switches, the more likely that it can interfere with another signal. Therefore, signals that have fast rising or falling transition slopes, like clock signals, should be analyzed further, while signals with relatively slow rising and falling edges may be filtered out.

Figure 6:
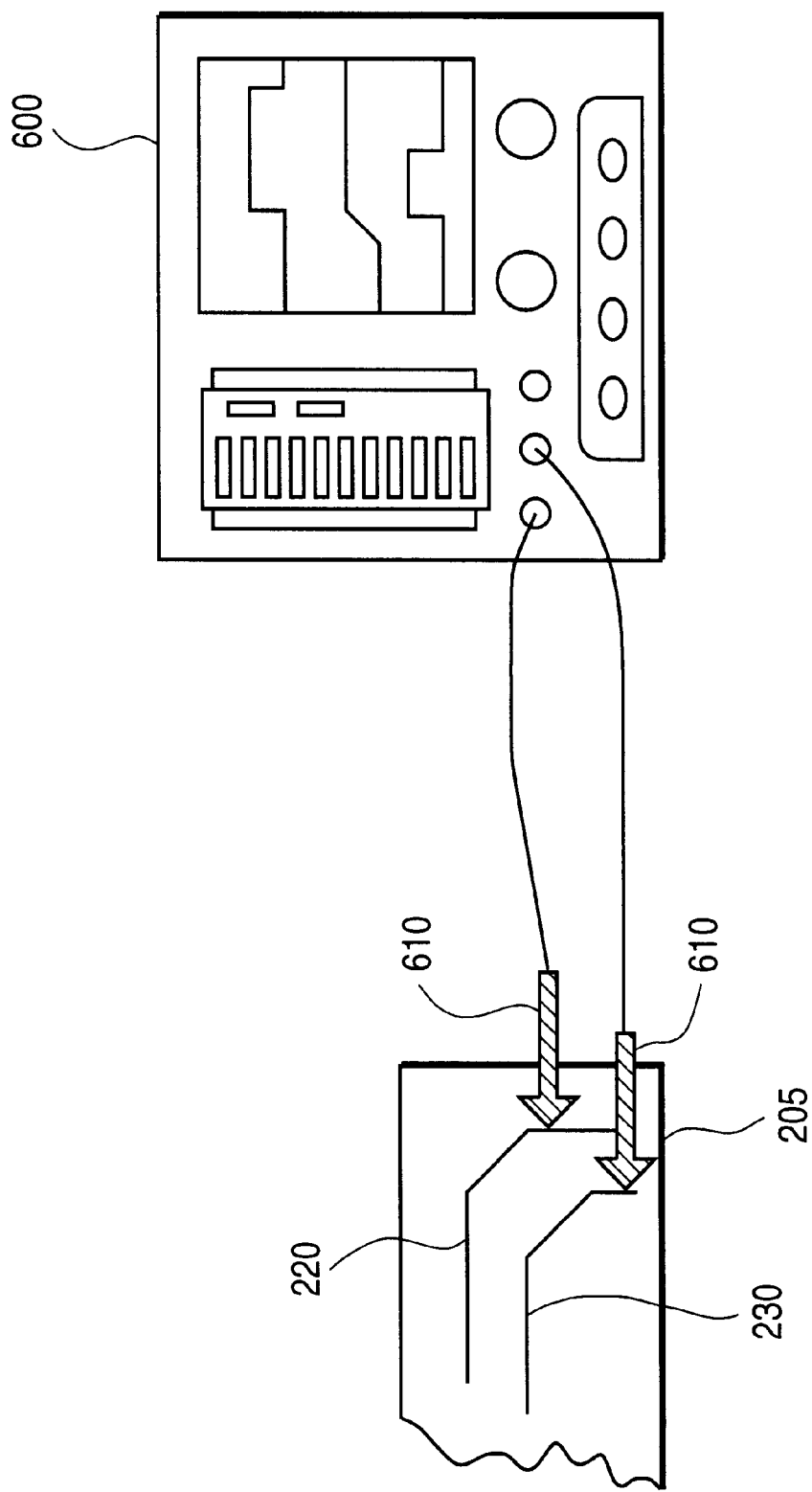
FIG. 6 illustrates an oscilloscope monitoring an attacker signal and a victim signal through oscilloscope signal probes.

Turning now to FIG. 6, an apparatus useful in performing a method for measuring the rising and the falling slopes of potential attacker signals to perform timing filtering, is shown. The potential attacker signal on the trace 230 is connected to an oscilloscope 600, through oscilloscope signal probes 610. As specified at block 135 in FIG. 1, a threshold rise and fall rate (Voltage per second), that may cause cross-talk problems, is determined. The transitions of the attacker signals are monitored on the oscilloscope 600. The rising and falling slopes of the potential attacker signals are then measured on the oscilloscope 600. At block 140, a determination is made regarding whether the rate of the attacker signal's transition exceeds the pre-determined threshold rise and fall rate. Potential attacker signals are then filtered out if their slopes are not relatively fast, as specified at block 145 of FIG. 1. For example, in one embodiment of the invention, potential attacker signals are filtered out if their slope is slower than a predetermined rate (voltage per second). If it is determined that the rate of the transition of the attacker signals exceeds the pre-determined threshold rates, then some signal layout changes may be necessary to eliminate cross-talk problems, as specified at block 150.

Once a group of attacker signals are identified by using the timing filtration method, steps are taken to emulate their adverse effects on the minimum and maximum timing of the victim signals. One method of emulating the impact of the effects that the attacker signals have on the victim signal line, is manipulating its capacitance value. At block 155 of FIG. 1, the cross-capacitance value of the attacker signals are determined. The next step is to add the value of cross-coupling capacitance to Delta C Value. Delta C Value is the summation of the cross-coupling capacitances of all attacker signal lines, which have been through the timing and logic filtration processes, corresponding to a victim signal line.

During evaluation, in the case where the victim signal is experiencing a speed-up dynamic delay variation, the Delta C Value is added to the victim node. This causes a slow down of the transition of the victim signal, causing the switching of the victim signal to conform to the minimum delay. The added value of Delta C Value slows down the transition of the victim signal. The added capacitance forces the driver to drive more charge to complete the transition, thereby slowing down the transition and bringing it within the proper switching timing window 320.

During evaluation, in the case where the victim signal is experiencing a slow-down dynamic delay variation, Delta C Value is subtracted from the victim node. This causes a speed-up of the transition of the victim signal, causing the switching of the victim signal to conform to the maximum delay. The decrease in the capacitor value due to the subtraction of the Delta C Value speeds up the transition of the victim signal. The decrease in the victim trace capacitor value will decrease the amount of charge that the driver has to drive to make a transition, thereby speeding up the transition and bringing it within the proper switching timing window 320.

Furthermore, applying logic filtering can divide groups of attacker signal lines into different subsets. The subset of attacker signal lines that yields the highest Delta C Value is chosen as the worst case Delta C Value. In the case where the attacker signals switch near the latest time the victim signal switches (as described at block 120), the worst case positive Delta C value is determined along with the maximum push-out due to the worst case Delta C, as described at block 160.

At block 165, a determination is made whether the timing push-out caused by the application of the Delta C value is larger than the setup-time margin 310. If it is determined that the timing push-out is not larger than the setup-time margin 310, then there will be no timing problems for that particular victim signal. Thus, the effect of the potential attacker signals can be ignored, as described at block 145.

Conversely, if it is determined that the timing push-out is larger than the set-up margin 310, then steps to fix the timing problem must be taken, as described at block 170. These steps include alerting the designer so manual steps may be taken, and automatically correcting the timing problems. The automatic correction of the problems include: modifying the layout to reduce cross-talk from fast switching attackers; increasing the victim signal's driver-strength to reduce the timing push-out; and slowing down attacker signals that have large setup margins.

In the case where the attacker signals switch near the earliest time the victim signal switches (as described at block 125), the worst case negative Delta C value is determined along with the maximum push-in due to the worst case Delta C, as described at block 175.

At block 180, a determination is made whether the timing push-in caused by the application of the Delta C value is larger than the hold-time margin 410. If it is determined that the timing push-in is not larger than the hold-time margin 410, then there will be no timing problems for that particular victim signal. Thus, the effect of the potential attacker signals can be ignored, as described at block 145.

Conversely, if it is determined that the timing push-in is larger than the hold time margin 410, then steps to fix the timing problem must be taken, as described at block 170. These steps include alerting the designer so manual steps may be taken, and automatically correcting the timing problems. The automatic correction of the problems include: modifying the layout to reduce cross-talk from fast switching attackers; increasing the victim signal's driver-strength to reduce the timing push-out; and slowing down attacker signals that have large setup margins. All of these steps can be performed iteratively until timing problems are reduced. At this point timing problems due to cross-talk should be reduced, as described at block 185.

Figure 7:
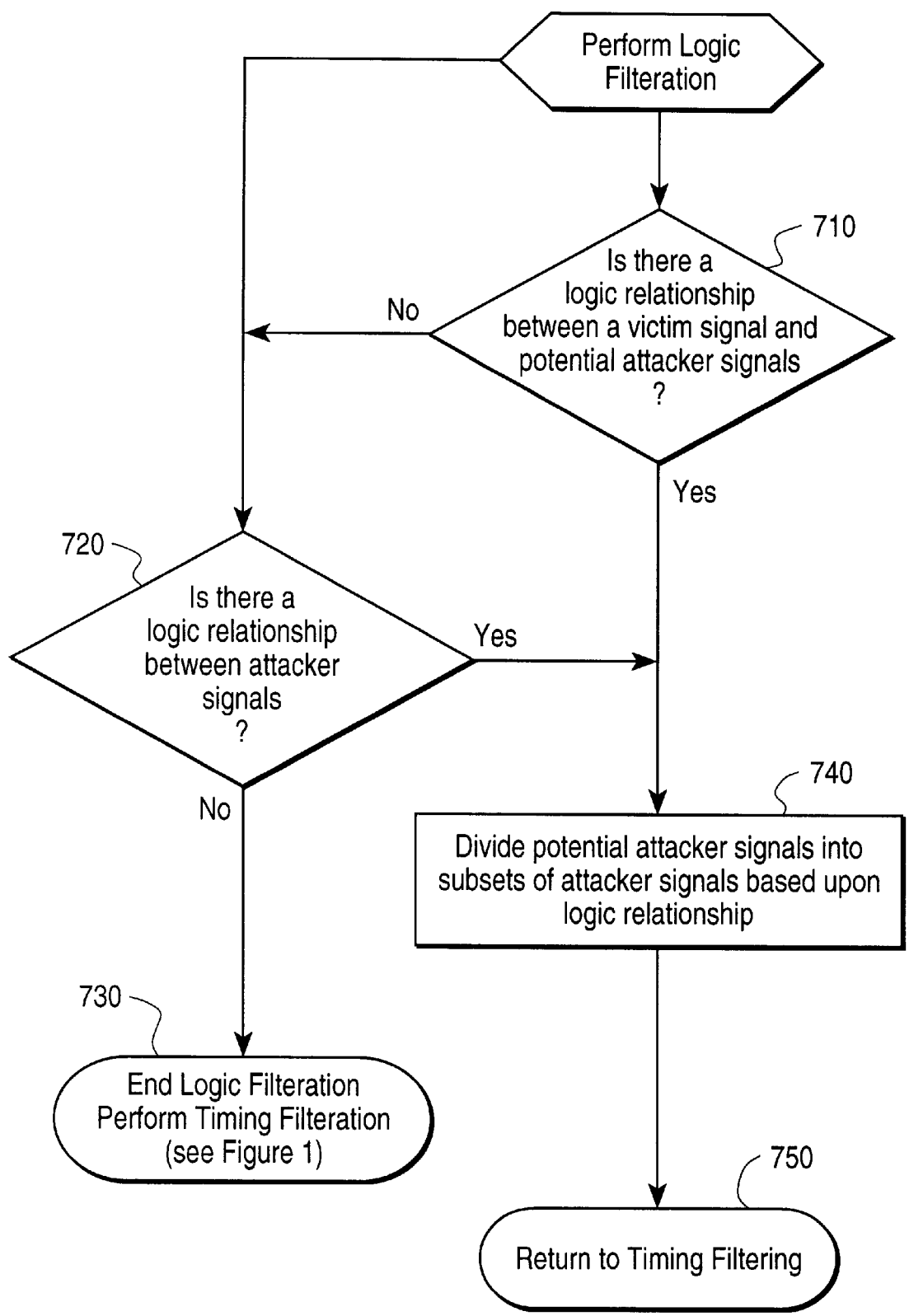
FIG. 7 is a flow chart illustrating one method for performing logic filtration.

Another method of efficiently checking for true attacker signals is to perform logic filtering. Logic filtering consists of analyzing the logical relationship between signals. FIG. 7 illustrates one method for logic filtration. At block 710, a determination whether there exists a logic relationship between a victim signal and a potential attacker signal is made. At block 720, a determination is made whether there is a logic relationship between attacker signals. If it is determined that there is no logic relationship between a victim signal and a potential attacker signal, nor is there a logic relationship between potential attacker signals, then at block 730 logic filtration is terminated and timing filtration may be initiated.

Figure 8:
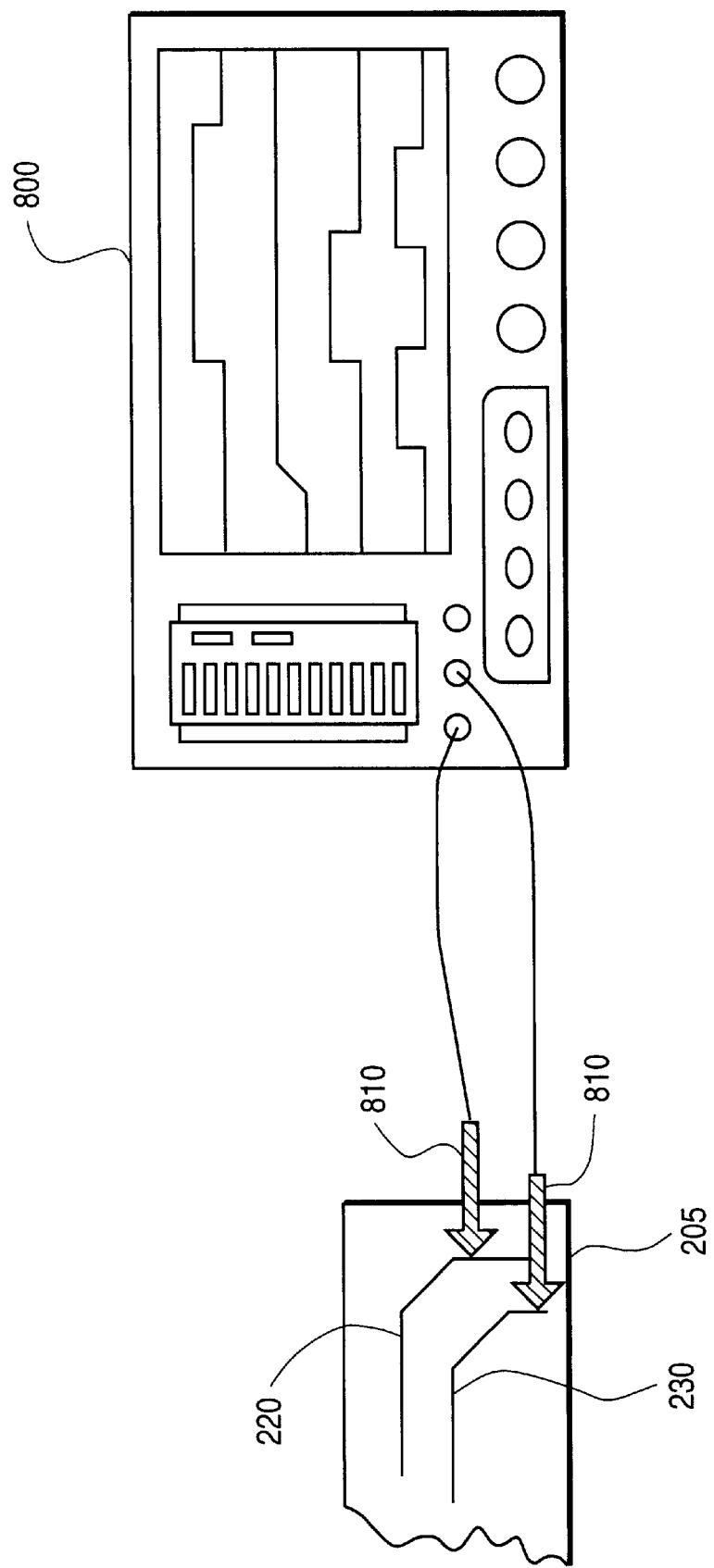
FIG. 8 illustrates a logic analyzer device monitoring an attacker signal and a victim signal through logic analyzer signal probes.

One method of performing logic filtering is by using a logic analyzer to study the relationship between signals. Turning now to FIG. 8, the victim signals and the attacker signals are connected to a logic analyzer 800 through logic analyzer signal probes 810. Logic filtering is performed to eliminate potential attacker signals that have no logic relationship with the victim signals or group attacker signals together that have a logic relationship.

Once it is determined that a logic relationship exits between a victim signal and a potential attacker signal or between potential attacker signals, at block 740 the potential attacker signals are divided into subsets of attacker signals, based upon logic relationships. This information is used in the timing filteration process, as described at block 750. Specifically, logic filteration is utilized at block 130 of FIG. 1 (Timing Filteration). The subset of attacker signal with the worse case Delta C value is used for timing filteration.

Other steps, such as modifying the layout to reduce cross-talk and adding delay buffers may also be employed in order to reduce timing problems. The entire process, of timing filtering, logic filtering, adding the Delta C Value and subtracting the Delta C Value, can be repeated until all of the victim traces are sufficiently operating inside an acceptable switching timing window 320. Thus, the chance of producing an uncontaminated design with no hidden speed paths and no hold time problems, is dramatically improved.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method for analyzing cross-coupling induced timing effects between an attacker signal line and a victim signal line comprising:

simulating victim and attacker signals on the victim and attacker signal lines respectively;

determining a victim signal-level transition of the victim signal;

determining minimum and maximum delays for the victim signal-level transition to establish a timing window in which the victim signal-level transition is operative for correct signal transfer on the victim signal line;

determining an occurrence of an attacker signal-level transition on the attacker signal line;

determining if the attacker signal-level transition is switching in a same or opposite direction as the victim signal-level transition;

determining if the attacker signal-level transition, based on the same or opposite switching direction, either reduces the minimum delay or increases the maximum delay of the signal on the victim signal line; and reducing the effects of the cross-coupling if the attacker signal-level transition causes the minimum or maximum delay to extend outside of the timing window.

2. The method of claim 1, wherein said determining the delays to establish the window includes:

adding a set-up time margin for the victim signal past the maximum delay;

adding a hold time margin for the victim signal prior to the minimum delay the window including the two margins.

3. The method of claim 1, wherein said simulating the signals includes simulating signals for a plurality of attacker lines and said determining the attacker signal-level transition is achieved for each attacker line.

4. The method of claim 3, further includes determining if a logic relationship exists between two or more attacker signals where one attacker signal is dependent from another attacker signal; and eliminating one of the logically related attacker signals from the cross-coupling analysis.

5. The method of claim 1, wherein said determining the attacker signal-level switching includes a minimum to maximum range for the transition to occur.

6. The method of claim 1, wherein said determining the attacker signal-level transition includes determining if the transition reduces the minimum delay outside of the window if the attacker signal-level transition is in the same direction as the victim signal-level transition or determining if the transition increases the maximum delay outside of the window if the attacker signal-level transition is in the opposite direction as the victim signal-level transition.

7. The method of claim 6, wherein said reducing the effects of the cross-coupling further includes filtering to remove the attacker line from cross-coupling analysis if the attacker signal-level transition does not correspond to the minimum or maximum delay depending on the switching direction.

8. The method of claim 6, wherein said reducing the effects of the cross-coupling further includes the determining of cross-coupling capacitance and adjusting the cross-coupling capacitance by correspondingly increasing or decreasing the cross-coupling capacitance or victim line capacitance until the cross-coupling effect is reduced.

9. The method of claim 6, wherein said reducing the effects of said cross-coupling further includes adjusting a timing of the signal residing on the victim signal line such that the effects of the attacker signal-level transition does not reduce the minimum delay or increase the maximum delay outside of the timing window.

10. The method of claim 9 wherein said reducing the effects of the cross-coupling is achieved by adjusting the cross-coupling capacitance.

11. The method of claim 6, wherein said reducing the effects of the cross-coupling is achieved by reducing a signal level of the attacker signal.

12. The method of claim 1, wherein said reducing the effects of the cross-coupling further includes the determining of cross-capacitance and adjusting the cross-capacitance by correspondingly increasing or decreasing the cross-capacitance or victim line capacitance until the cross-coupling effect is reduced.

13. The method of claim 1 further including the fabricating of a device after reducing the effects of the cross-coupling.

* * * * *